(12) United States Patent
Beauchamp et al.

(10) Patent No.: US 7,326,594 B2
(45) Date of Patent: Feb. 5, 2008

(54) CONNECTING A PLURALITY OF BOND PADS AND/OR INNER LEADS WITH A SINGLE BOND WIRE

(75) Inventors: Bruce Beauchamp, Gilbert, AZ (US); Andrew Tuthill, Te Puke (NZ); Joseph D. Fernandez, Nonthaburi (TH); Anucha Phongsantichai, Bangkok (TH)

(73) Assignee: Microchip Technology Incorporated, Chandler, AZ (US)

( * ) Notice: Subject to any disclaimer, the term of this patent is extended or adjusted under 35 U.S.C. 154(b) by 0 days.

(21) Appl. No.: 11/563,803

(22) Filed: Nov. 28, 2006

(65) Prior Publication Data

US 2007/0215994 A1 Sep. 20, 2007

Related U.S. Application Data

(63) Continuation-in-part of application No. 10/209,502, filed on Jul. 31, 2002, now Pat. No. 7,157,790.

(51) Int. Cl.
*H01L 21/50* (2006.01)
*H01L 21/48* (2006.01)
*H01L 21/44* (2006.01)
*H01L 21/00* (2006.01)

(52) U.S. Cl. ............... 438/123; 438/48; 438/111; 438/612; 438/617; 257/459; 257/672; 257/673; 257/676; 257/E23.024; 257/E23.031

(58) Field of Classification Search .......... 438/48, 438/111, 123, 612, 617; 257/459, 672, 673, 257/676, E23.024, E23.031
See application file for complete search history.

(56) References Cited

U.S. PATENT DOCUMENTS 4,987,475 A 1/1991 Schlesinger et al. ........ 257/666

(Continued)

FOREIGN PATENT DOCUMENTS

JP 60001968 A 1/1985

OTHER PUBLICATIONS

Otter, Chris: "Wirebonding in microelectronics", http://www.twi.co.uk/j32k/protected/band_3/kscco001.html, Feb. 2001.

(Continued)

*Primary Examiner*—Michael Lebentritt
*Assistant Examiner*—Mohsen Ahmadi
(74) *Attorney, Agent, or Firm*—Baker Botts L.L.P.

(57) ABSTRACT

An integrated circuit device comprising an integrated circuit die having a plurality of bond pads that are selectively connected to a plurality of inner leads of a leadframe. At least two bond pads are connected to at least one of the inner leads, and/or at least two inner leads are connected to at least one of bond pads with a single bond wire. A single bond wire is ball or wedge bonded to a first bond pad or inner lead and subsequently wedge bonded to one or more second bond pads or inner leads, then it is connected to a third or last bond pad or inner lead. The single bond wire requires only one connection area at each of the bond pad(s) and/or inner lead(s). The bond pad(s) of the die and/or inner lead(s) of the leadframe are thereby electrically connected together by the single bond wire.

16 Claims, 8 Drawing Sheets

U.S. PATENT DOCUMENTS

| | | | |
|---|---|---|---|
| 5,252,853 A | 10/1993 | Michii | 257/666 |
| 5,254,501 A | 10/1993 | Tung et al. | 29/827 |
| 5,502,289 A * | 3/1996 | Takiar et al. | 174/266 |
| 5,552,966 A | 9/1996 | Nagano | 361/813 |
| 5,646,451 A | 7/1997 | Freyman et al. | 257/784 |
| 5,814,881 A | 9/1998 | Alagaratnam et al. | 257/686 |
| 5,818,114 A | 10/1998 | Pendse et al. | 257/786 |
| 5,838,072 A | 11/1998 | Li et al. | 257/786 |
| 5,886,393 A | 3/1999 | Merrill et al. | 257/531 |
| 5,903,443 A | 5/1999 | Schoenfeld et al. | 361/813 |
| 6,008,533 A | 12/1999 | Bruce et al. | 257/691 |
| 6,051,887 A | 4/2000 | Hubbard | 257/777 |
| 6,133,637 A | 10/2000 | Hikita et al. | 257/777 |
| 6,169,329 B1 | 1/2001 | Farnworth et al. | 257/780 |
| 6,208,579 B1 | 3/2001 | Prutchi et al. | 365/230.01 |
| 6,291,894 B1 | 9/2001 | Farnworth et al. | 257/780 |
| 6,320,259 B1 | 11/2001 | Yamauchi et al. | 257/734 |
| 6,326,235 B1 | 12/2001 | Glenn | 438/106 |
| 6,376,909 B1 | 4/2002 | Forbes et al. | 257/734 |
| 6,380,635 B1 * | 4/2002 | Manning et al. | 257/784 |
| 6,406,943 B2 | 6/2002 | Corisis | 438/123 |
| 6,407,456 B1 | 6/2002 | Ball | 257/777 |
| 6,476,506 B1 | 11/2002 | O'Connor et al. | 257/786 |
| 6,506,625 B1 | 1/2003 | Moden | 438/107 |
| 6,551,860 B2 | 4/2003 | Uner et al. | 438/115 |
| 6,603,072 B1 | 8/2003 | Foster et al. | 174/536 |
| 6,608,368 B2 | 8/2003 | Ohashi | 257/668 |
| 6,674,177 B2 * | 1/2004 | Schoenfeld | 257/784 |
| 2001/0023994 A1 | 9/2001 | Oka | |
| 2002/0058357 A1 | 5/2002 | Oka | |

OTHER PUBLICATIONS

Chapter A: Wire Bonding, Level 2. Conclusions and guideline, Wirebonding techniques; 16 pages, no date.

* cited by examiner

CONNECTING A PLURALITY OF BOND PADS AND/OR INNER LEADS WITH A SINGLE BOND WIRE

RELATED PATENT APPLICATION

This application is a continuation-in-part of commonly owned U.S. patent application Ser. No. 10/209,502, filed Jul. 31, 2002, now U.S. Pat. No. 7,157,790, issued Jan. 2, 2007, entitled "Single Die Stitch Bonding" by Bruce Beauchamp, Andrew Tuthill, Joseph D. Fernandez and Anucha Phongsantichai, and is hereby incorporated by reference herein for all purposes.

TECHNICAL FIELD

The present disclosure relates to connections made to integrated circuit bond pads and integrated circuit package external connections, and more particularly to connecting related bond pads and/or integrated circuit package external connections with a continuous single bond wire.

BACKGROUND

An Integrated circuit device may comprise a semiconductor integrated circuit die mounted on a leadframe. The semiconductor integrated circuit die may comprise a plurality of bond pads that are electrically connected to inner leads of the leadframe, e.g., using bond wires. The semiconductor integrated circuit die, the inner portion of the leadframe (inner leads) and the bond wires may be encapsulated in an integrated circuit package. After encapsulation, a border or frame on the outer portion of the leadframe is cut to separate outer leads of the leadframe into connecting pins or surface mount contacts which are used to electrically connect the electronic circuitry in the semiconductor integrated circuit die with other externally arranged electronic components mounted on a substrate or printed circuit board.

Integrated circuit devices are becoming more and more sophisticated while integrated circuit package size and the number of available package connections are being reduced. Limiting the number of package connections available for connecting to device circuits is necessary for both size and cost constraints. However, this may create a problem for the integrated circuit device manufacturer who must offer integrated circuit devices for many different types of configurations and applications. Integrated circuit device cost is reduced when a large quantity of the same device is produced. It is relatively easy to fabricate an integrated circuit device capable of many different configurations and uses then to have to perform various different metal mask operations so as to fabricate differently configured integrated circuit devices. A specific device configuration may then be selected during fabrication of the integrated circuit device with the leadframe by appropriate jumper connections between the die bond pads and inner lead fingers of the leadframe. Typically, various combinations of die bond pads are connected together through common connections to an inner lead(s) of the leadframe. However selecting a specific configuration in this fashion for configuration of the integrated circuit device becomes problematic when the reduced die, package and leadframe areas available for interconnecting option selection pads of the integrated circuit die are reduced in size. Making more than one wirebond connection to a die bond pad and/or inner lead of a leadframe may not be practical or even possible in the smaller and more densely packaged integrated circuits.

Having integrated circuit dice with a great number of functionalities enables fabrication of one type of integrated circuit die that may be configured for many different applications, thus saving inventories of many different types of dice and/or having to run die wafers through different masking operations. As the integrated circuit die becomes smaller, so does the integrated circuit package become smaller as does the availability of fewer external package connections, e.g., pins. Therefore the most economical way to produce integrated circuit devices is to increase the quantity during fabrication and production thereof, and selectively configure the integrated circuit device during automatic wire bonding of the integrated circuit die to the external package connections, e.g., leadframe.

In addition to having greater functionality available in the newer technology integrated circuit die, the newer fabrication processes that produce smaller integrated circuit dice result in being able to put more than one integrated circuit die in an integrated circuit package. However, electrically connecting the two or more dice together and/or to the external leadframe connections of the integrated circuit package also presents a problem because of the ever decreasing bond pad sizes and closer proximity between the smaller bond pads on the newer technology integrated circuit dice.

SUMMARY

Therefore, there is a need for connecting a plurality of integrated circuit bond pads and/or inner leads of a leadframe together without requiring multiple connections thereto. According to the teachings of this disclosure, the above-identified problems may be overcome as well as other shortcomings and deficiencies of existing technologies by providing multiple common connections in an integrated circuit device while requiring only a single connection point at each of the commonly connected integrated circuit die bond pads and/or inner leads of a leadframe. A single wire may be ball or wedge (stitch) bonded between one or more die bond pads and one or more inner leads of a leadframe, and/or between a plurality of bond pads to create a common connection therebetween. Bond pads between two or more integrated circuit dice may be interconnected for configuring certain specific connections and/or functionalities in a single integrated circuit package.

According to a specific example embodiment of this disclosure, an integrated circuit device may comprise: a leadframe having a plurality of inner leads; an integrated circuit die having a plurality of bond pads; and a single bond wire electrically coupling together at least two of the plurality of bond pads and at least one of the plurality of inner leads, wherein the single bond wire makes a first connection to a one of the at least two of the plurality of bond pads and a last connection to a one of the at least one of the plurality of inner leads such that the single bond wire is connected only once to each of the at least two of the plurality of bond pads and each of the at least one of the plurality of inner leads.

According to another specific example embodiment of this disclosure, an integrated circuit device may comprise: a leadframe having a plurality of inner leads; an integrated circuit die having a plurality of bond pads; and a single bond wire electrically coupling together at least two of the plurality of bond pads and at least one of the plurality of inner leads, wherein the single bond wire makes a first connection to a one of the at least one of the plurality of inner leads and a last connection to a one of the at least two of the plurality of bond pads such that the single bond wire is connected only once to each of the at least one of the plurality of inner leads and each of the at least two of the plurality of bond pads.

According to yet another specific example embodiment of this disclosure, an integrated circuit device may comprise: an integrated circuit die having a plurality of bond pads; and a single bond wire electrically coupling together at least three of the plurality of bond pads, wherein the single bond wire makes a first connection to a first one of the at least three of the plurality of bond pads and a last connection to a last one of the at least three of the plurality of bond pads such that the single bond wire is connected only once to each of the at least three of the plurality of bond pads.

According to another specific example embodiment of this disclosure, an integrated circuit device may comprise: a leadframe having a plurality of inner leads; a first integrated circuit die having a first plurality of bond pads and at least one re-route bond pad; a second integrated circuit die having a second plurality of bond pads; and a single bond wire electrically coupling together at least one of the first plurality of bond pads, the at least one re-route bond pad and at least one of the second plurality of bond pads; wherein the single bond wire makes a first connection to a first one of the at least one of the first plurality of bond pads, an intermediate connection to the at least one re-route bond pad and a last connection to a last one of the at least one of the second plurality of bond pads such that the single bond wire is connected only once to each of the at least one of the first plurality of bond pads, the at least one re-route bond pad and each of the at least one of the second plurality of bond pads.

According to still another specific example embodiment of this disclosure, a method of making electrical connections between an integrated circuit die and a leadframe with a single bond wire may comprise the steps of: providing a leadframe having a plurality of inner leads; providing an integrated circuit die having a plurality of bond pads; providing a single bond wire; and connecting together at least two of the plurality of bond pads and at least one of the plurality of inner leads with the single bond wire, wherein the single bond wire makes a first connection to a one of the at least two of the plurality of bond pads and a last connection to a one of the at least one of the plurality of inner leads such that the single bond wire is connected only once to each of the at least two of the plurality of bond pads and each of the at least one of the plurality of inner leads.

According to another specific example embodiment of this disclosure, a method of making electrical connections between an integrated circuit die and a leadframe with a single bond wire may comprise the steps of: providing a leadframe having a plurality of inner leads; providing an integrated circuit die having a plurality of bond pads; providing a single bond wire; and connecting together at least two of the plurality of bond pads and at least one of the plurality of inner leads with the single bond wire, wherein the single bond wire makes a first connection to a one of the at least one of the plurality of inner leads and a last connection to a one of the at least two of the plurality of bond pads such that the single bond wire is connected only once to each of the at least one of the plurality of inner leads and each of the at least two of the plurality of bond pads.

According to another specific example embodiment of this disclosure, a method of making electrical connections on an integrated circuit die with a single bond wire may comprise the steps of: providing an integrated circuit die having a plurality of bond pads; providing a single bond wire; and connecting together at least three of the plurality of bond pads with the single bond wire, wherein the single bond wire makes a first connection to a first one of the at least three of the plurality of bond pads and a last connection to a last one of the at least three of the plurality of bond pads such that the single bond wire is connected only once to each of the at least three of the plurality of bond pads.

According to yet another specific example embodiment of this disclosure, a method of making electrical connections on an integrated circuit die with a single bond wire may comprise the steps of: providing a first integrated circuit die having a first plurality of bond pads and at least one re-route bond pad; providing a second integrated circuit die having a second plurality of bond pads; providing a single bond wire; and connecting together at least one of the first plurality of bond pads, the at least one re-route bond pad and at least one of the second plurality of bond pads with the single bond wire, wherein the single bond wire makes a first connection to a first one of the at least one of the first plurality of bond pads, an intermediate connection to the at least one re-route bond pad and a last connection to a last one of the at least one of the second plurality of bond pads such that the single bond wire is connected only once to each of the at least one of the first plurality of bond pads, the at least one re-route bond pad and each of the at least one of the second plurality of bond pads.

BRIEF DESCRIPTION OF THE DRAWINGS

A more complete understanding of the present disclosure thereof may be acquired by referring to the following description taken in conjunction with the accompanying drawings wherein.

While the present disclosure is susceptible to various modifications and alternative forms, specific example embodiments thereof have been shown in the drawings and are herein described in detail. It should be understood, however, that the description herein of specific example embodiments is not intended to limit the disclosure to the particular forms disclosed herein, but on the contrary, this disclosure is to cover all modifications and equivalents as defined by the appended claims.

DETAILED DESCRIPTION

Referring now to the drawings, the details of specific example embodiments are schematically illustrated. Like elements in the drawings will be represented by like numbers, and similar elements will be represented by like numbers with a different lower case letter suffix.

The term "wirebonding" is generally accepted to mean the interconnection (via wire) of components, contact pads and conducting tracks. There are two basic wirebonding techniques that may be used in thermocompression (T/C), thermosonic (T/S) or ultrasonic (U/S) bonding processes, they are "ball bonding" and "wedge bonding." Referring to FIG. 1, in ball bonding a wire, e.g., bond wire 110, is passed through a hollow capillary tool (not shown) and a small portion of the end of this wire is heated to a molten condition wherein the surface tension of the molten metal forms a spherical shape, or ball, as the bond wire material solidifies. The ball at the end of the wire is pressed onto a bond pad 104 of the semiconductor die 102 with sufficient force to cause plastic deformation and atomic interdiffusion of the ball and the underlying metallization of the bond pad 104. This creates a low resistance connection between the bond pad 104 and the ball at the end of the bond wire 110.

Figure 1:
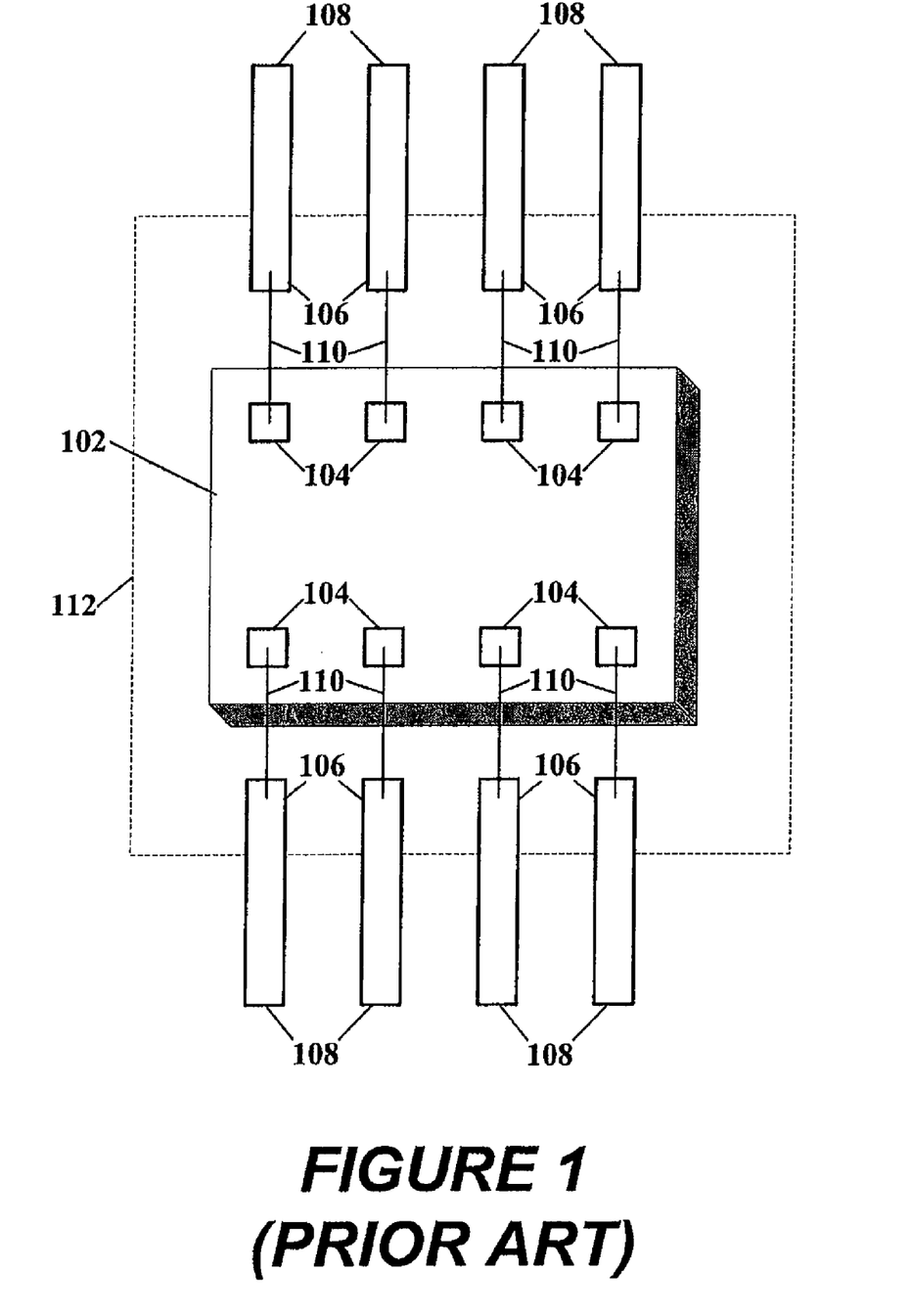
FIG. 1 is a schematic plan view of a prior art integrated circuit device comprising an integrated circuit die having bond pads thereon and connected with bond wires to respective ones of inner leads of a leadframe.

The capillary tool containing the wire is then raised and repositioned over the next connection point, e.g., inner lead 106 of the leadframe. A precisely shaped wire connection called a wire loop is thus created. Deforming the wire against the inner lead 106 makes the second bond (e.g., wedge bond or stitch bond). The deformation of the wire against the inner lead 106 may have a crescent or fishtail shape made by the imprint of the capillary tool's outer geometry. After this second connection is made, the wire is clamped and then broken off after the bond connection.

Wedge bonding derives its name from the shape of the bonding capillary tool. In wedge bonding, the wire is fed at an angle from about 30-60 degrees from the horizontal bonding surface through a hole in the back of a bonding wedge of the capillary tool. Normally, forward bonding is preferred, i.e., the first bond is made to the die bond pad 104 and the second bond is made to the inner lead 106 of the leadframe. After the first bond operation, the wedge bonding capillary tool rises and executes a motion to create a desired wire loop shape (bond wire). At the second bond location, the wedge bonding capillary tool descends and makes the second bond connection. The movement of the axis of the wedge bonding capillary tool allows the wire to freely feed through the hole in the wedge bonding capillary tool. The bonded wire may be separated from the wire remaining in the wedge bonding capillary tool by using clamps to break the wire while machine bonding force is maintained on the second bond (clamp tear), or the clamp remains stationary and the wedge bonding capillary tool raises off the second bond area to tear the wire apart (table tear).

The wire is made of a conductive material such as metal, e.g., gold, copper, aluminum, combinations of these metals (alloys), or alloys of these metals in combination with other metals, e.g., Silicon (Si) and/or magnesium (Mg). The bonding surfaces may be coated or plated with a compatible conductive material, e.g., gold, aluminum, gold, or nickel, etc. It is contemplated and within the scope of this disclosure that any type of conductive material, e.g., metal or metal alloy may be used.

Referring to FIG. 1, depicted is a schematic plan view of a prior art integrated circuit device comprising an integrated circuit die having bond pads thereon and connected with bond wires to respective ones of inner leads of a leadframe. The integrated circuit die 102 may have a plurality of bond pads 104 thereon. The bond pads 104 are connected to the electronic circuits (not shown) of the integrated circuit die 102. A leadframe (not entirely shown, but well known to those skilled in the art of integrated circuits) comprises a plurality of inner leads 106, a plurality of outer leads 108 and a support structure or "die paddle" (not shown). The integrated circuit die 102 is initially supported by the leadframe die paddle. The outer leads 108 may be formed into connecting pins or surface mount contacts as desired. Bond wires 110 electrically connect the bond pads 104 to respective ones of the inner leads 106. The integrated circuit die 102 and supporting die paddle, bond pads 104, inner leads 106 and bond wires 110 may be encapsulated in an integrated circuit package, schematically depicted by the outline referenced by the numeral 112.

Figure 2:
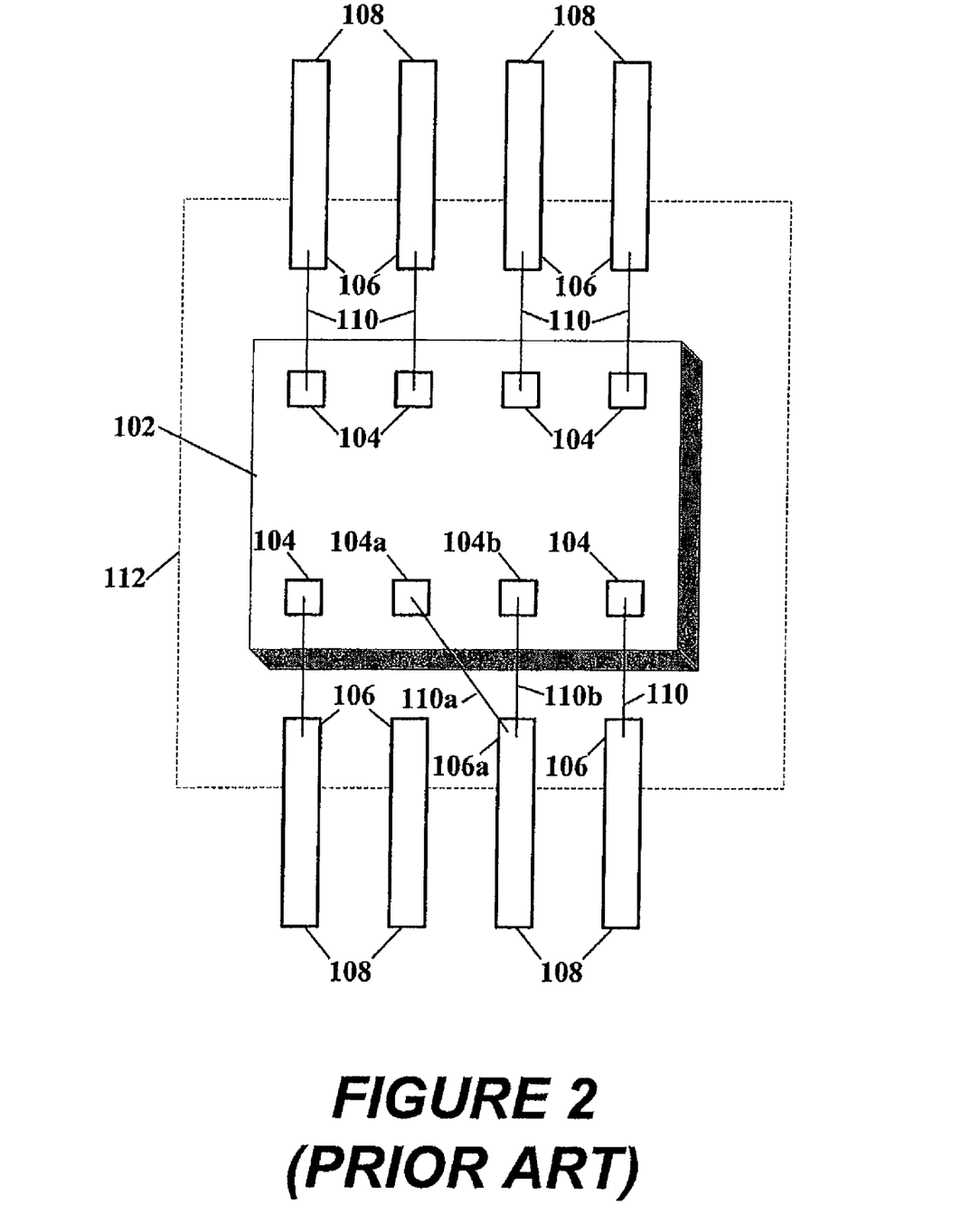
FIG. 2 is a schematic plan view of a prior art integrated circuit device comprising an integrated circuit die having two bond pads thereon and connected with two bond wires to a common inner lead of a leadframe.

Referring to FIG. 2, depicted is a schematic plan view of a prior art integrated circuit device comprising an integrated circuit die having two bond pads thereon and connected with two bond wires to a common inner lead of a leadframe. Two bond wires 110a and 110b are attached to the inner lead 106a and thereby electrically interconnect bond pad 104a, bond pad 104b and the inner lead 106a together. A problem exists however in that the inner lead 106a must have sufficient free bonding area to accommodate two bond wire connections. When more than two interconnections are required, this bonding area problem is further exasperated. As semiconductor integrated circuit devices become smaller and more complex, there may not be sufficient bonding area on an inner lead or bond pad to accommodate more than one bond wire connection.

Figure 3:
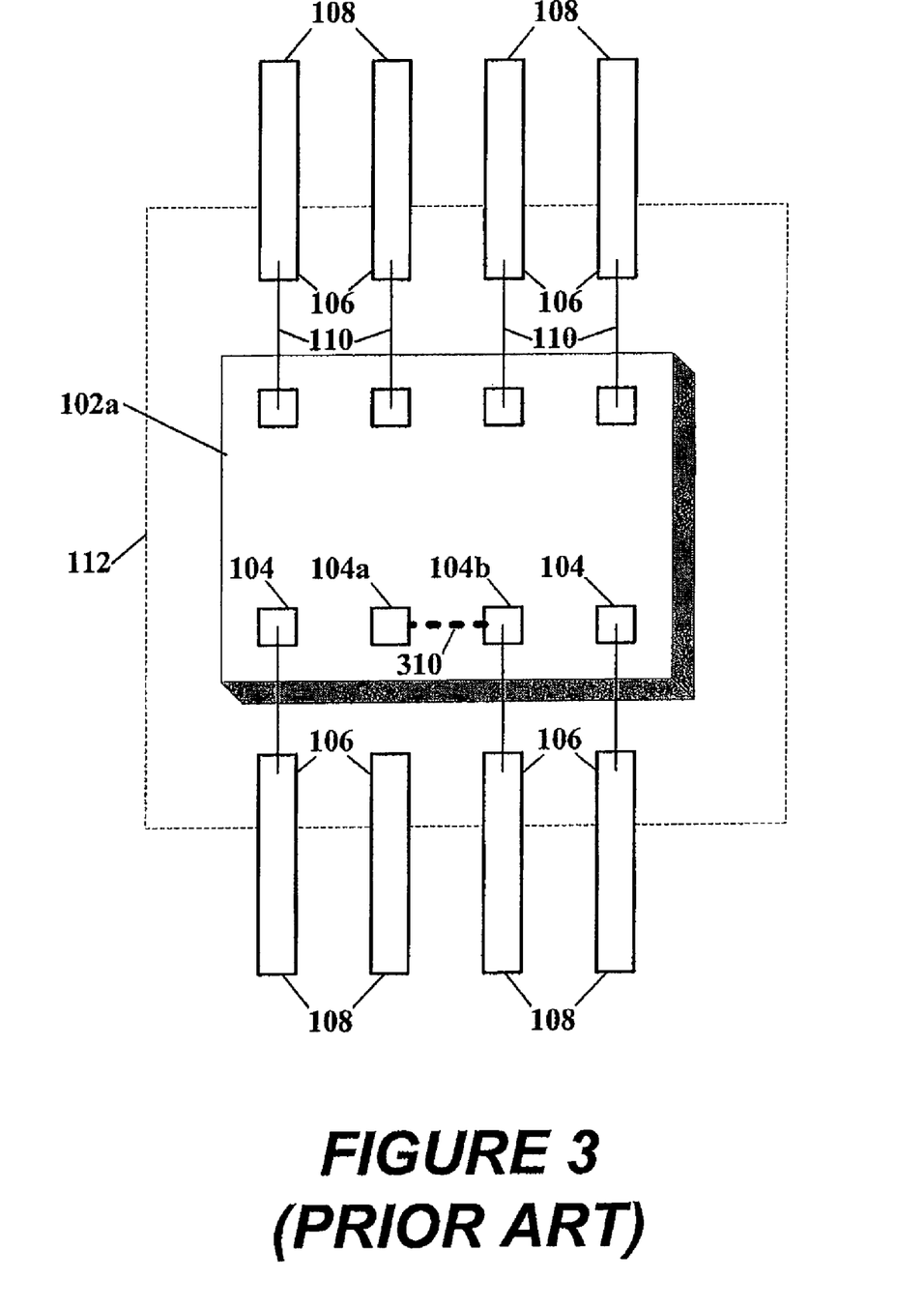
FIG. 3 is a schematic plan view of a prior art integrated circuit device comprising an integrated circuit die having two bond pads thereon and connected with an internal metal mask jumper.

Referring to FIG. 3, depicted is a schematic plan view of a prior art integrated circuit device comprising an integrated circuit die having two bond pads thereon and connected with an internal metal mask jumper. During fabrication of the semiconductor integrated circuit die 102a, a conductive jumper 310 may be created during a metallization step in the die fabrication process so as to interconnect, for example, bond pads 104a and 104b. The jumper 310 may be used to configure or set options within the die 102a, however, different metallization masks and batch runs must be performed during the integrated circuit die fabrication process to achieve these different integrated circuit options. Thus, using mask jumper(s) 310 is not cost effective for a small quantity of semiconductor devices. In addition, a greater parts inventory is required when using mask jumpers since larger quantities of each semiconductor die configuration must be fabricated in order to be cost effective.

Figure 4:
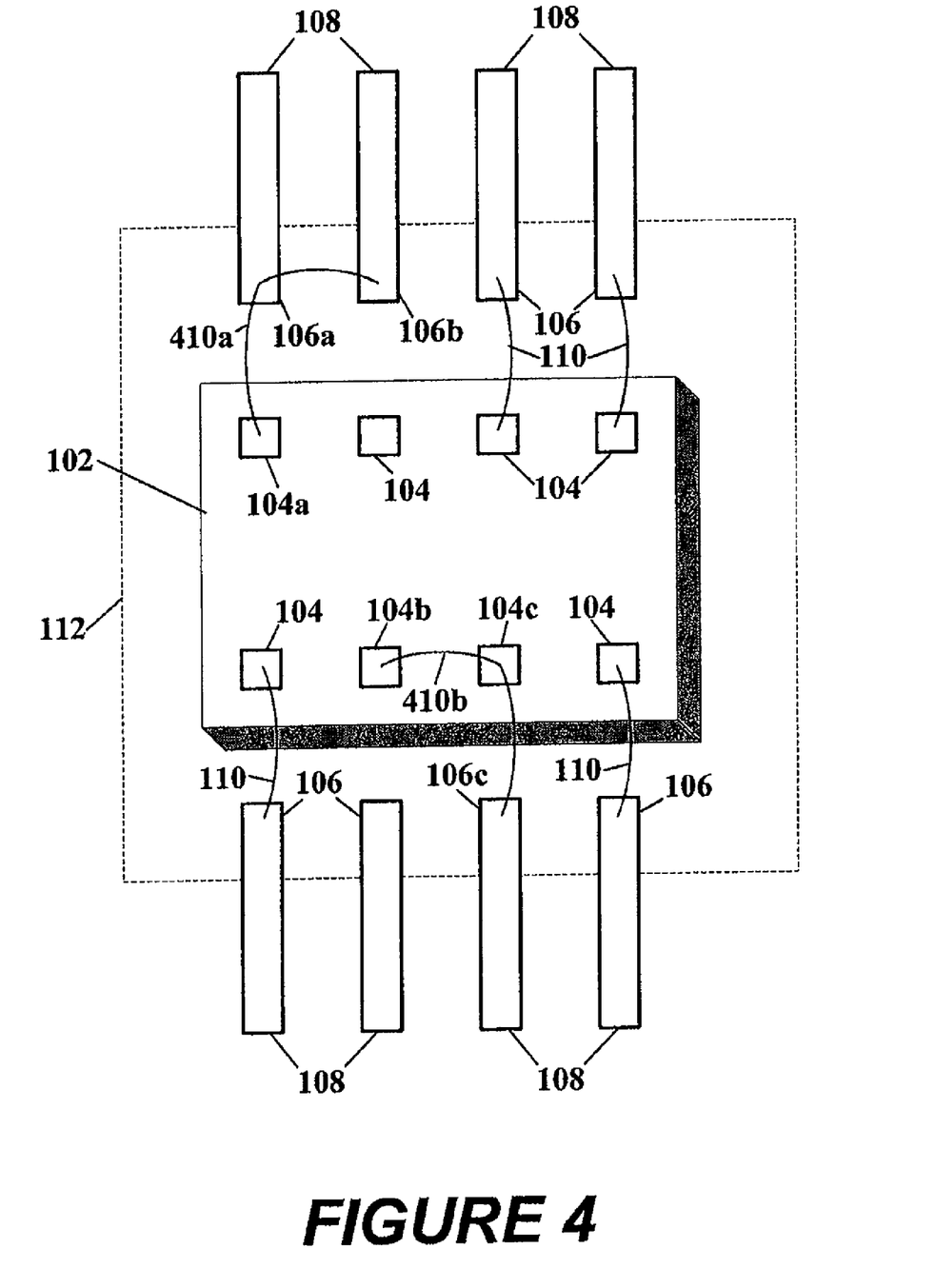
FIG. 4 is a schematic plan view of an integrated circuit device comprising an integrated circuit die having two bond pads thereon and an inner lead of a leadframe and connected together with a single bond wire, and two other inner leads of the leadframe connected to another bond pad with another single bond wire, according to specific example embodiments of this disclosure.

Referring now to FIG. 4, depicted is a schematic plan view of integrated circuit device comprising an integrated circuit die having two bond pads and an inner lead of a leadframe and connected together with a single bond wire, and two other inner leads of the leadframe connected to another bond pad with another single bond wire, according to specific example embodiments of this disclosure. A single bond wire 410a connects bond pad 104a, inner lead 106a and inner lead 106b together and requires only one bond point a each connection area of the bond pad 104a, inner lead 106a and inner lead 106b. A ball or wedge bond connection may be used at the first connection point of the bond wire 410a, and subsequent connection points may use wedge (stitch) bonding. The bond wire 410a remains unbroken (continuous) until the last connection has been made. The first connection of the bond wire 410a may begin at either bond pad 104a or inner lead 106b. The first connection may be at the bond pad 104a. The intermediate connection at the inner lead 106a may be a wedge (stitch) bond wherein the bond wire 410a remains unbroken. For example, a simple interconnection operation may be performed as follows. First, the capillary tool bonds the bond wire 410a to the bond pad 104a of the die 102, then the capillary tool moves to the inner lead 106a. A wedge (stitch) bond is made to the inner lead 106a, and then the capillary tool moves to the inner lead 106b and bonds the bond wire 410a thereto. In a similar fashion, bond wire 410b may interconnect bond pad 104b, bond pad 104c and inner lead 106c together.

Figure 5:
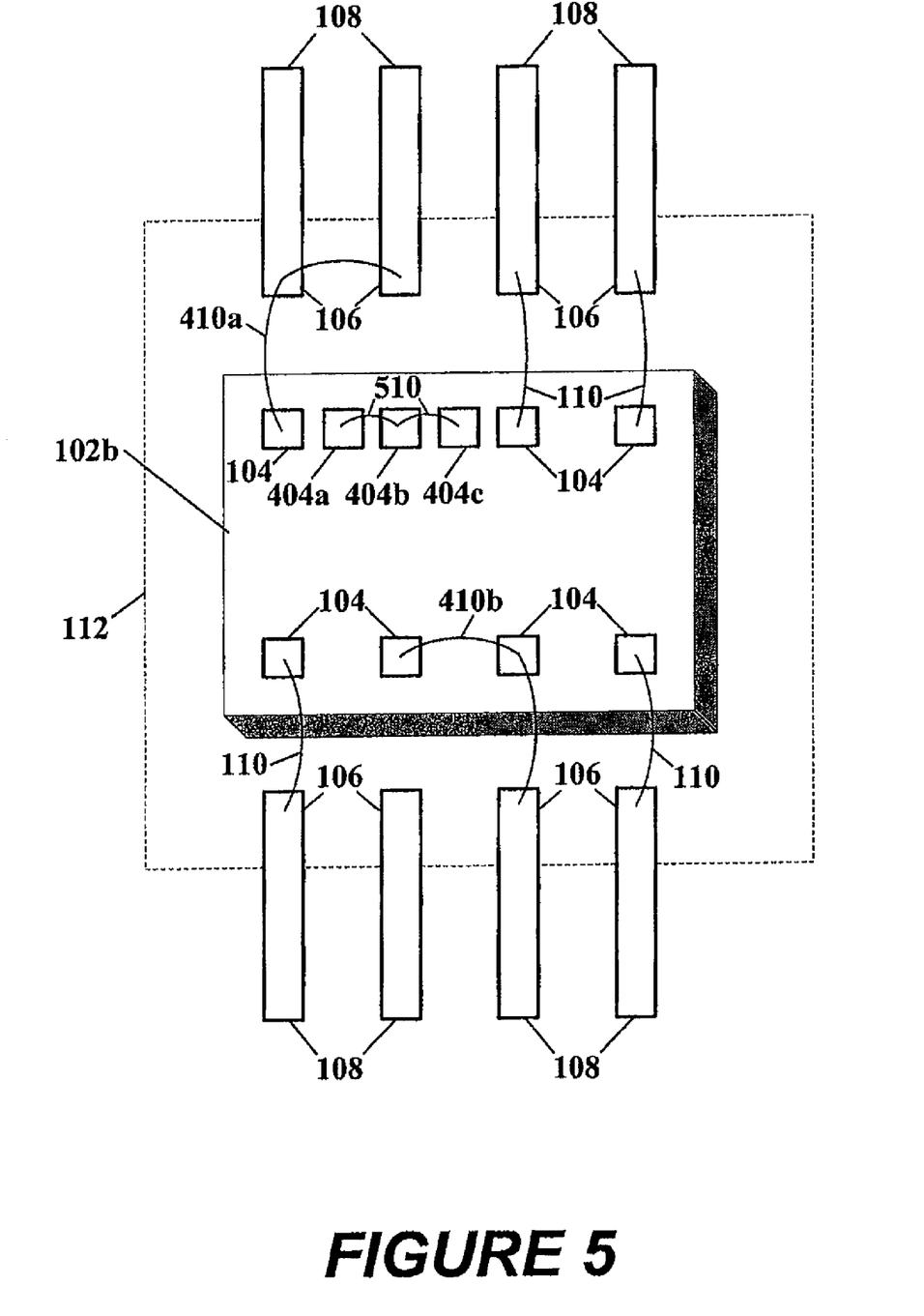
FIG. 5 is a schematic plan view of the integrated circuit device illustrated in FIG. 4 and further comprising a device mode selection jumper connecting mode option selection bond pads on the die, according to another specific example embodiment of this disclosure.

Referring now to FIG. 5, depicted is a schematic plan view of the integrated circuit die illustrated in FIG. 4 with the addition of a device mode selection jumper commonly connecting mode option selection bond pads on the die, according to another specific example embodiment of this disclosure. Bond pads 404a, 404b and 404c are exemplary and may be greater or fewer in number depending upon the application and number of operational modes that may be selected for the semiconductor integrated circuit die 102b. A single bond wire 510 may connect bond pads 404a, 404b and 404c together. When a different option or die configuration is desired, the bond pads 404a, 404b and 404c may be interconnected or left unconnected as required.

Figure 6:
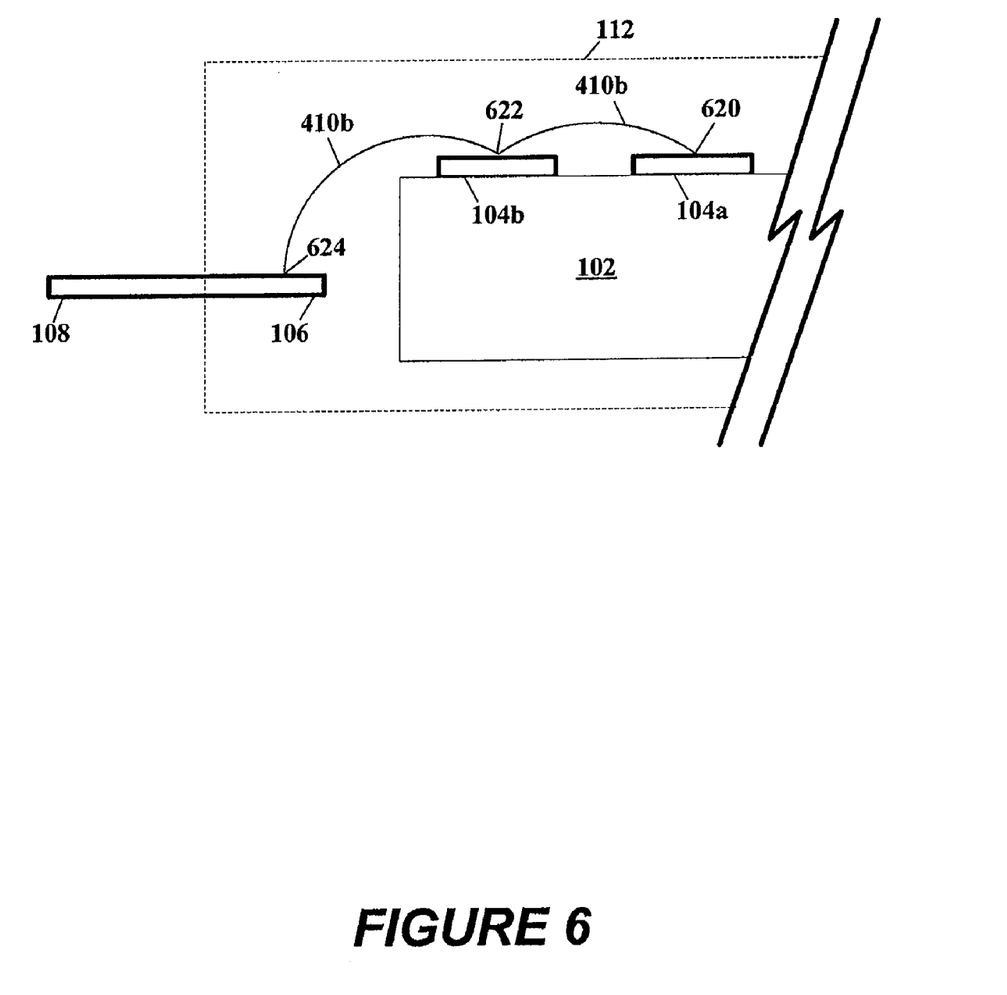
FIG. 6 is a schematic elevational view of an integrated circuit device having a single bond wire connecting bond pads of an integrated circuit die to an inner leadframe, according to specific example embodiments of this disclosure.

Referring now to FIG. 6, depicted is a schematic elevational view of an integrated circuit device having a single bond wire connecting bond pads of an integrated circuit die to an inner leadframe, according to specific example embodiments of this disclosure. The first connection of the bond wire 410b may begin at either bond pad 104a or inner lead 106. Preferably, the first connection will be at the bond pad 104a. A connection to bond pad 104b may be made by wedge bonding the bond wire 410b which remains unbroken or continuous until bonded to the inner lead 106. After the bond wire 410b has been bonded to the inner lead 106, it is separated from the wire at the tip of the capillary tool, thus completing the wedge (stitch) bond using the single bond wire 410b.

Figure 7:
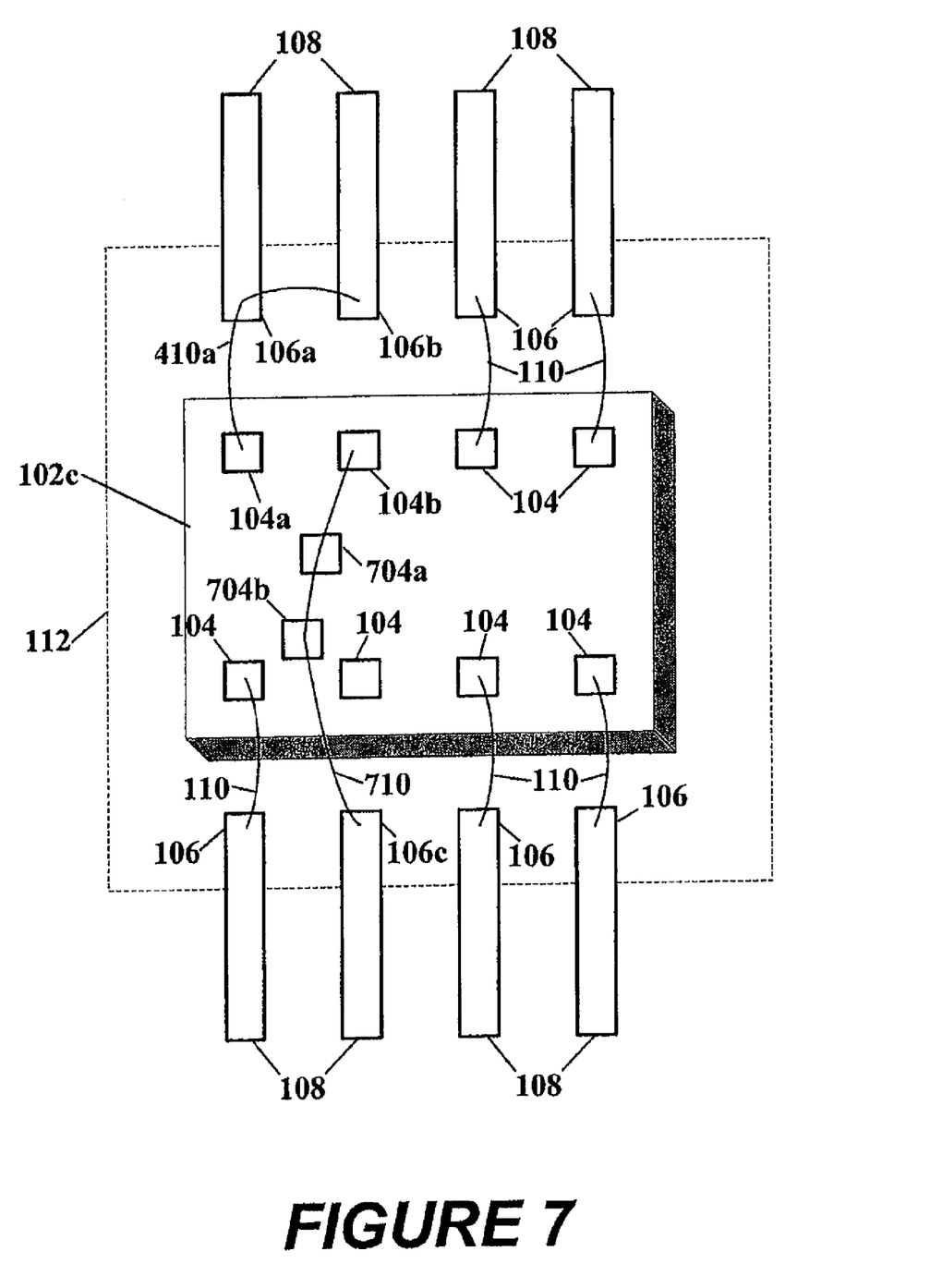
FIG. 7 is a schematic plan view of an integrated circuit device comprising an integrated circuit die having bond pads and re-route bond pads thereon and an inner lead of a leadframe connected together with a single bond wire, according to yet another specific example embodiment of this disclosure.

Referring now to FIG. 7, depicted is a schematic plan view of an integrated circuit device comprising an integrated circuit die having bond pads and re-route bond pads thereon and an inner lead of a leadframe connected together with a single bond wire, according to yet another specific example embodiment of this disclosure. Bond pad 104b is connected to inner lead 106c with a single bond wire 710. However, the single bond wire 710 must be routed across the face of the integrated circuit die 102c and between the bond pads 104 at the lower left thereof. Doing so without intermediate support and routing of the single bond wire 710 would not work for fabrication and reliability reasons. By using the re-route bond pads 704a and 704b, the single bond wire 710 routing may be easily fabricated and produce a reliable integrated circuit device 112.

Figure 8:
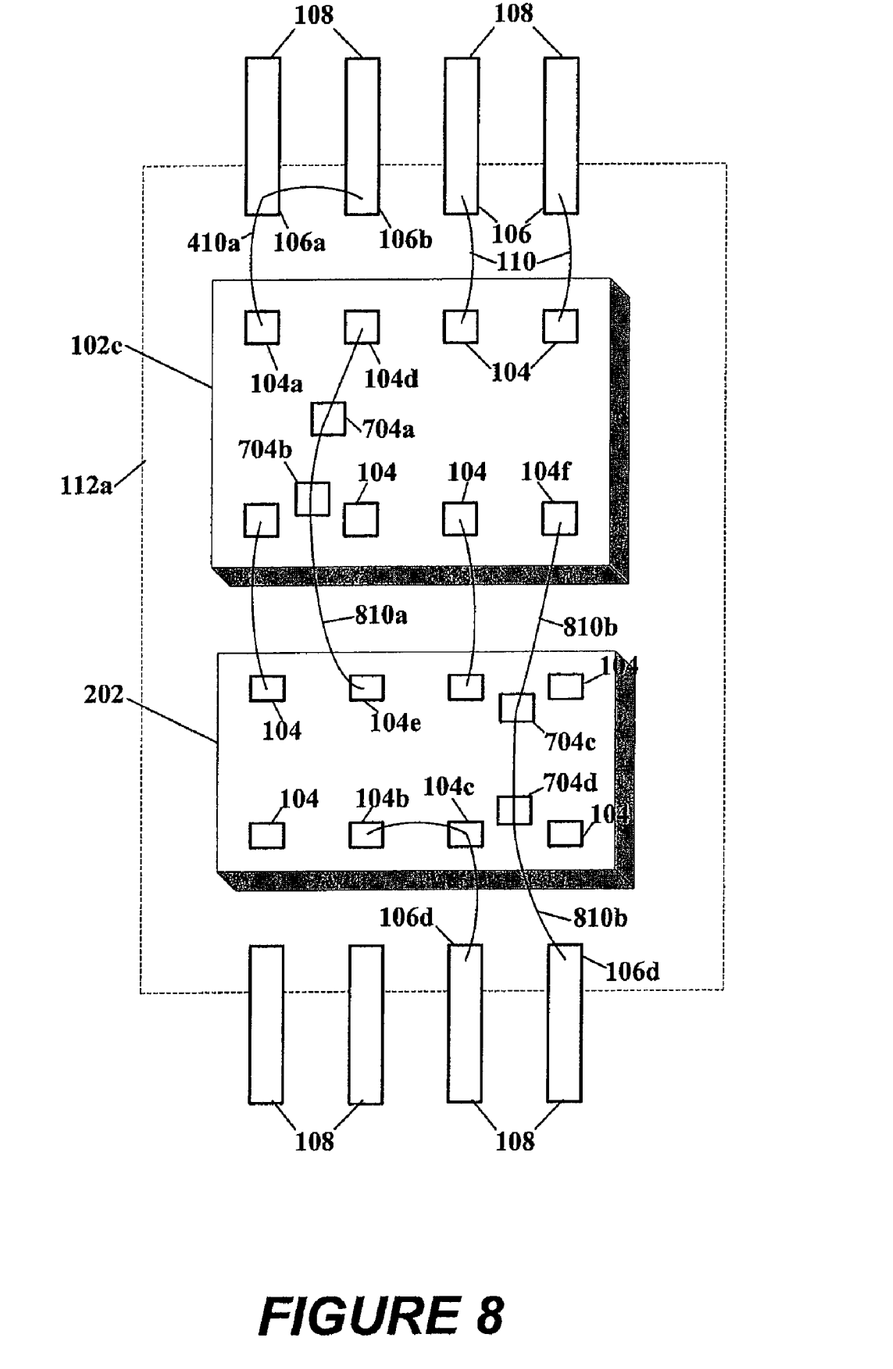
FIG. 8 is a schematic plan view of an integrated circuit device comprising two integrated circuit dice in an integrated circuit package with certain ones of the bond pads of the two integrated circuit dice being connected together and to certain inner leads of a leadframe, according to another specific example embodiments of this disclosure.

Referring now to FIG. 8, depicted is a schematic plan view of an integrated circuit device comprising two integrated circuit dice in an integrated circuit package with certain ones of the bond pads of the two integrated circuit dice being connected together and to certain inner leads of a leadfame, according to specific example embodiments of this disclosure. A first integrated circuit die 102c has re-route bond pads 704a and 704b, and a second integrated circuit die 202 has re-route bond pads 704c and 704d. Both the first and second integrated circuit dice 102c and 202, and leadframe inner leads 106 are enclosed in an integrated circuit package 112a. Bond pads 104 are connected to the inner leads 108 with bond wires 110, bond pad 104a is connected to inner leads 106a and 106b with a single bond wire 410a, and bond pads 104b and 104c are connected to inner lead 106c with a single bond wire 410b, as more fully described hereinabove.

When a circuit function, e.g., input, output, input-output, etc., of the integrated circuit die 102c is to be connected to another circuit function of the integrated circuit die 202, the bond pad 104d on die 102c may be connected to the bond pad 104e on die 202 with a single bond wire 810a. However the bond pads 104d and 104e are too far apart in distance for reliable connection using a bond wire. By using the re-route bond pads 704a and 704b as intermediate support/connection points for the single bond wire 810a the distance (and support) between connection points of the single bond wire 810a are within safe design limits.

When a circuit function, e.g., input, output, input-output, etc., of the integrated circuit die 102c is to be connected to an inner lead 106d but there is an obstacle, e.g., die 202, in the way, the bond pad 104f on die 102c may be connected to the inner lead 106d on die 202 with a single bond wire 810b. However the bond pad 104f inner lead 106d are too far apart in distance (and the die 202 is in the way) for reliable connection using a bond wire. By using the re-route bond pads 704c and 704d as intermediate support/connection points for the single bond wire 810b the distance, and support and interference of the die 202 between connection points of the single bond wire 810a are within safe and reliable design limits.

While embodiments of this disclosure have been depicted, described, and are defined by reference to example embodiments of the disclosure, such references do not imply a limitation on the disclosure, and no such limitation is to be inferred. The subject matter disclosed is capable of considerable modification, alteration, and equivalents in form and function, as will occur to those ordinarily skilled in the pertinent art and having the benefit of this disclosure. The depicted and described embodiments of this disclosure are examples only, and are not exhaustive of the scope of the disclosure.

What is claimed is:

1. A method of making electrical connections between an integrated circuit die and a leadframe with a single bond wire, said method comprising the steps of:
   providing a leadframe having a plurality of inner leads;
   providing an integrated circuit die having a plurality of bond pads;
   providing a single bond wire; and
   connecting together at least two of the plurality of bond pads and at least one of the plurality of inner leads with the single bond wire, wherein the single bond wire makes a first connection to a one of the at least two of the plurality of bond pads and a last connection to a one of the at least one of the plurality of inner leads such that the single bond wire is connected only once to each of the at least two of the plurality of bond pads and each of the at least one of the plurality of inner leads.

2. The method of claim 1, wherein the step of connecting comprises the steps of making the first connection with a ball bond and making subsequent connections with wedge bonds.

3. The method of claim 1, wherein the step of connecting comprises the steps of making the first and subsequent connections of the single bond wire with wedge bonds.

4. The method of claim 1, further comprising the step of connecting the single bond wire to a re-route bond pad between the step of the first connection and the step of the last connection thereof.

5. A method of making electrical connections between an integrated circuit die and a leadframe with a single bond wire, said method comprising the steps of:
  providing a leadframe having a plurality of inner leads;
  providing an integrated circuit die having a plurality of bond pads;
  providing a single bond wire; and
  connecting together at least two of the plurality of bond pads and at least one of the plurality of inner leads with the single bond wire, wherein the single bond wire makes a first connection to a one of the at least one of the plurality of inner leads and a last connection to a one of the at least two of the plurality of bond pads such that the single bond wire is connected only once to each of the at least one of the plurality of inner leads and each of the at least two of the plurality of bond pads.

6. The method of claim 5, wherein the step of connecting comprises the steps of making the first connection with a ball bond and making subsequent connections with wedge bonds.

7. The method of claim 5, wherein the step of connecting comprises the steps of making the first and subsequent connections of the single bond wire with wedge bonds.

8. The method of claim 5, further comprising the step of connecting the single bond wire to a re-route bond pad between the step of the first connection and the step of the last connection thereof.

9. A method of making electrical connections on an integrated circuit die with a single bond wire, said method comprising the steps of:
  providing an integrated circuit die having a plurality of bond pads;
  providing a single bond wire; and
  connecting together at least three of the plurality of bond pads with the single bond wire, wherein the single bond wire makes a first connection to a first one of the at least three of the plurality of bond pads and a last connection to a last one of the at least three of the plurality of bond pads such that the single bond wire is connected only once to each of the at least three of the plurality of bond pads.

10. The method of claim 9, wherein the step of connecting comprises the steps of making the first connection with a ball bond and making subsequent connections with wedge bonds.

11. The method of claim 9, wherein the step of connecting comprises the steps of making the first and subsequent connections of the single bond wire with wedge bonds.

12. The method of claim 9, further comprising the step of configuring options of the integrated circuit die by connecting selected ones of the plurality of bond pads with the single bond wire.

13. The method of claim 9, further comprising the step of connecting the single bond wire to a re-route bond pad between the step of the first connection and the step of the last connection thereof.

14. A method of making electrical connections between first and second integrated circuit dice with a single bond wire, said method comprising the steps of:
  providing a first integrated circuit die having a first plurality of bond pads and at least one re-route bond pad;
  providing a second integrated circuit die having a second plurality of bond pads;
  providing a single bond wire; and
  connecting together at least one of the first plurality of bond pads, the at least one re-route bond pad and at least one of the second plurality of bond pads with the single bond wire, wherein the single bond wire makes a first connection to a first one of the at least one of the first plurality of bond pads, an intermediate connection to the at least one re-route bond pad and a last connection to a last one of the at least one of the second plurality of bond pads such that the single bond wire is connected only once to each of the at least one of the first plurality of bond pads, the at least one re-route bond pad and each of the at least one of the second plurality of bond pads.

15. The method of claim 14, wherein the step of connecting comprises the steps of making the first connection with a ball bond and making subsequent connections with wedge bonds.

16. The method of claim 14, wherein the step of connecting comprises the steps of making the first and subsequent connections of the single bond wire with wedge bonds.

* * * * *